(12) United States Patent
Ikura

(10) Patent No.: US 8,362,549 B2  
(45) Date of Patent: Jan. 29, 2013

(54) TRENCH GATE SEMICONDUCTOR DEVICE AND THE METHOD OF MANUFACTURING THE SAME

(75) Inventor: Yoshihiro Ikura, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 69 days.

(21) Appl. No.: 12/974,189

(22) Filed: Dec. 21, 2010

(65) Prior Publication Data

US 2011/0156137 A1    Jun. 30, 2011

(30) Foreign Application Priority Data

Dec. 25, 2009  (JP) .................. 2009-295036

(51) Int. Cl.
  *H01L 29/76*  (2006.01)
  *H01L 31/062* (2006.01)
(52) U.S. Cl. ........ 257/330; 257/328; 257/329; 257/331; 257/341; 438/270
(58) Field of Classification Search .......... 257/328–332, 257/341, E29.262, E29.201, E21.41; 438/270
See application file for complete search history.

(56) References Cited

U.S. PATENT DOCUMENTS

| | | | |
|---|---|---|---|
| 6,246,090 B1 * | 6/2001 | Brush et al. | ................... 257/329 |
| 6,351,009 B1 | 2/2002 | Kocon et al. | |
| 6,818,946 B1 | 11/2004 | Venkatraman | |
| 6,921,939 B2 | 7/2005 | Zeng | |
| 2006/0141739 A1 | 6/2006 | Poelzl | |

FOREIGN PATENT DOCUMENTS

JP    2006-157016 A    6/2006

OTHER PUBLICATIONS

Tsui, Bing-Yue et al."A Novel Fully Self-Aligned Process for High Cell Density Trench Gate Power MOSFETs" Proceedings at 2004 International Symposium on Power Semiconductor Devices & ICs, Kitakyushu, P-11, IEEE ISPSD 2004, pp. 205-208.

* cited by examiner

*Primary Examiner* — Theresa T Doan
(74) *Attorney, Agent, or Firm* — Rossi, Kimms & McDowell LLP

(57) ABSTRACT

A trench gate semiconductor device is disclosed which has a trench gate structure including an insulator in the upper portion of a first trench, the insulator being on a gate electrode; a source region having a lower end surface positioned lower than the upper surface of the gate electrode; a second trench in the surface portion of a semiconductor substrate between the first trenches, the second trench having a slanted inner surface providing the second trench with the widest trench width at its opening and a bottom plane positioned lower than the lower end surface of the source region, the slanted inner surface being in contact with the source region; and a p-type body-contact region in contact with the slanted inner surface of the second trench. The trench gate semiconductor device and its manufacturing method facilitate increasing the channel density and lowering the body resistance of the parasitic BJT.

4 Claims, 14 Drawing Sheets

TRENCH GATE SEMICONDUCTOR DEVICE AND THE METHOD OF MANUFACTURING THE SAME

BACKGROUND OF THE INVENTION

A. Field of the Invention

The present invention relates to MOS semiconductor devices used in switching power supplies. Specifically, the invention relates to trench gate semiconductor devices and the method of manufacturing the trench gate semiconductor devices. More specifically, the invention relates to a trench gate MOSFET including a source region and a contact-trench formed by self-alignment or a trench gate IGBT including a source region and a contact-trench formed by self-alignment. More specifically, the invention relates also to the method of manufacturing the trench gate MOSFET or the trench gate IGBT.

B. Description of the Related Art

Generally, it is required for the semiconductor devices used in switching power supplies to sustain the voltage applied thereto in the OFF-state and to exhibit low resistance (low ON-state resistance) against the current made to flow in the ON-state of the semiconductor devices. In the low-voltage semiconductor devices, capable of sustaining a voltage as high as several tens V (the breakdown voltage thereof is several tens V), the channel resistance in the MOS structure occupies a large part of the ON-state resistance. To reduce the channel resistance per unit area, the semiconductor devices (trench gate MOSFET's and trench gate IGBT's) having a trench gate structure that facilitates increasing the channel density mainly have been used. For further increasing the channel density, the spacing between the trenches (trench gates), in which a gate is formed, has been made to be narrower and narrower.

Now the standard layer structure in a trench gate MOSFET will be described. The trench gate MOSFET includes an n-type substrate, the resistance of which is low; a drain layer on the back surface of the substrate; an n-type drift layer, the resistance of which is high, on the drain layer for sustaining the breakdown voltage; and a p-type body region on the front surface side of the drift layer. In the surface portion of the p-type body region, an $n^+$ source region and a $p^+$ body-contact region are formed selectively. A trench is formed from the surface portion of the p-type body region in contact with the $n^+$ source region. The trench bottom plane is in contact with the n-type drift layer. A gate oxide film is formed on the trench inner wall. Polysilicon that works as a gate electrode is loaded in the trench with the gate oxide film interposed between the polysilicon and the trench inner wall.

An insulator such as a silicon oxide film is disposed on the gate electrode. A source electrode, in contact commonly with the $n^+$ source region surface and the $p^+$ body-contact region surface, covers the insulator. In forming a contact region, through which the source electrode is in contact with the $n^+$ source region surface and the $p^+$ body-contact region surface, it is necessary to form a mask pattern that covers the regions other than the $n^+$ source region and the $p^+$ body-contact region so as not to make the source electrode short-circuit to the gate electrode nor to the drain layer. In order for the source electrode not to short-circuit to the gate electrode or to the drain layer, it is necessary to design the trench gate MOSFET with a certain size margin for absorbing the alignment deviations of the mask pattern. A design that considers the size margin causes a barrier against increasing the pattern density, including the channel density.

To overcome the barrier described above, the following U.S. Pat. No. 6,818,946 and U.S. Pat. No. 6,351,009, and Bing-Yue Tsui et al., "A Novel Fully Self-Aligned Process for High Cell Density Trench Gate Power MOSFETs", *IEEE ISPSD* 2004, Proceeding of 2004 International Symposium on Power Semiconductor Devices & ICs, Kitakyushu, each describe the structure shown in FIG. 2(*a*), and the method for forming the structure shown in FIG. 2(*a*). As shown in FIG. 2(*a*), the upper layer of gate electrode (gate polysilicon) 100 used for the trench gate MOSFET is polished by etching such that the loaded gate polysilicon 100 surface is positioned lower than substrate surface 101. Using silicon oxide film 102 covering polished gate polysilicon 100 and substrate surface 101 for a mask, $n^+$ source region 104 is formed in the upper side wall of trench 103 by oblique ion implantation into the side wall of trench 103. By employing a structure in which $n^+$ source region 104 is formed in the upper side wall of trench 103, it is possible to omit a mask alignment. Since no mask displacement is caused, it is not necessary to consider any mask alignment deviation in the device design in advance. Therefore, it is possible to further increase the channel density.

U.S. Pat. No. 6,921,939 describes another trench gate MOSFET structure shown in FIG. 2(*b*), in which $n^+$ source region 112 is formed by a self-alignment technique that does not employ any mask and the body resistance of a parasitic bipolar junction transistor (hereinafter referred to as a "parasitic BJT") is designed to be low.

According to the method for manufacturing the trench gate MOSFET structure shown in FIG. 2(*b*), the upper portion of trench 113, in the lower portion of which polysilicon gate 114 is formed, is filled with insulator 115. Then, the entire silicon surface, in which $n^+$ source region 112 is formed, is etched a little such that the silicon surface is positioned lower than the insulator 115 upper surface. A spacer is formed utilizing the step formed as described above between insulator 115 and the silicon. Then, the silicon is etched using the spacer as a mask for forming body-contact-trench 116 for reducing the body resistance of the parasitic BJT. By employing the method as described above, $n^+$ source region 112 and body-contact-trench 116 are formed securely without using any mask. Thus, a high channel density and low body resistance are obtained simultaneously.

Japanese Unexamined Patent Application Publication No. 2006-157016 describes another manufacturing method. Trenches spaced apart from each other by a mesa region are formed in a semiconductor substrate. A polysilicon gate electrode is formed in the trench with a gate insulator film interposed between the gate electrode and the trench. A concave portion is formed in the upper portion of the gate electrode. An insulator film is formed on the substrate surface. By a flattening treatment, the concave portion in the upper portion of the gate electrode positioned lower than the substrate surface is filled with the insulator film and the substrate surface is exposed. Using the insulator films filling the concave portions on the gate electrodes as masks, the portions of the substrate between the trenches are etched such that contact holes are formed in the substrate surface between the trenches.

In the trench gate MOSFET structure described in U.S. Pat. No. 6,818,946 and U.S. Pat. No. 6,351,009, the body region between the $n^+$ source regions becomes narrower as the spacing between the trenches is made to be narrower. This implies that the body resistance of the parasitic BJT formed of the $n^+$ source region, the body region and the drift region becomes higher. Since the parasitic BJT is liable to be turned off, when an avalanche breakdown is caused between the drift region and the n⁺ source region, the avalanche withstanding capability is liable to be low.

To minimize the n⁺ source region width in the trench gate MOSFET structure described in U.S. Pat. No. 6,921,939, it is necessary to minimize the spacer width, since the spacer width depends on the etching amount of the silicon surface. Since it is necessary to minimize the etching amount, it is difficult to control the manufacturing process. Since the heavily doped surface portion of n⁺ source region is polished by etching, the impurity concentration in the remaining n⁺ source region surface becomes low. Therefore, the contact resistance between the n⁺ source region surface and the source electrode is liable to be high.

In view of the foregoing, it would be desirable to obviate the problems described above. It would be also desirable to provide a trench gate semiconductor device that facilitates increasing the channel density thereof and reducing the body resistance of the parasitic BJT therein. It would be further desirable to provide a method of manufacturing a trench gate semiconductor device that facilitates increasing the channel density thereof and reducing the body resistance of the parasitic BJT therein.

The present invention is directed to overcoming or at least reducing the effects of one or more of the problems set forth above.

SUMMARY OF THE INVENTION

According to an aspect of the invention, there is provided a trench gate semiconductor device including:
 a semiconductor substrate including a drift region of a second conductivity type and a body region of a first conductivity type on the drift region;
 a source region of the second conductivity type formed selectively in a surface portion of the body region;
 a first trench formed from the surface of the body region to the drift region, the first trench being in contact with the source region;
 a polysilicon gate electrode in the lower portion of the first trench with a gate oxide film interposed between the polysilicon gate electrode and the inner wall of the first trench;
 an insulator in the upper portion of the first trench, the insulator being on the polysilicon gate electrode;
 the source region having a lower end surface positioned lower than the upper surface of the polysilicon gate electrode;
 a second trench in the surface portion of the semiconductor substrate between the first trenches, the second trench having a slanted inner surface providing the second trench with the widest trench width in the opening thereof and a bottom plane positioned lower than the lower end surface of the source region, the slanted inner surface being in contact with the source region in contact with the first trench;
 a body-contact region of the first conductivity type in the surface portion of the body region, the body-contact region being in contact with the slanted inner surface of the second trench;
 and
 the source region being doped more heavily on the side of the first trench surface.

Preferably, the trench gate semiconductor device is a MOSFET or an IGBT.

According to another aspect of the invention, there is provided a method of manufacturing a trench gate semiconductor device, the method including the steps of:
 (a) forming a first trench from the surface of a semiconductor substrate using an insulator film for a mask;
 (b) forming a polysilicon gate electrode in the lower portion of the first trench with a gate insulator film interposed between the inner wall of the first trench and the polysilicon gate electrode;
 (c) forming a source region in the upper side wall of the first trench using the insulator film and the polysilicon gate electrode for masks;
 (d) loading an insulator in the upper portion of the first trench such that the upper surface of the insulator is at the same level with the surface of the semiconductor substrate;
 (e) forming a second trench in the surface portion of the semiconductor substrate between the first trenches, the second trench having a slanted inner surface extending from the side wall of the first trench to the bottom plane of the second trench positioned lower than the lower end surface of the source region such that the source region is exposed to the slanted inner surface of the second trench;
 and
 (f) forming a body-contact region of a first conductivity type along the slanted inner surface of the second trench.

Preferably, the source region is formed by oblique ion implantation into the upper side wall of the first trench. Preferably, the source region is formed by a vapor-phase diffusion into the upper side wall of the first trench. Preferably, the source region is formed by a solid-phase diffusion into the upper side wall of the first trench.

Preferably, the step (d) includes the steps of:
 depositing the insulator on the semiconductor substrate; and
 polishing the insulator with a chemical mechanical polishing apparatus for positioning the upper surface of the insulator at the same level with the surface of the semiconductor substrate.

In one embodiment, the second trench is formed by chemical reactive ion etching. In another embodiment, the second trench is formed by anisotropic wet etching.

According to the invention, a semiconductor device that facilitates increasing the channel density and lowering the body resistance of the parasitic BJT therein is obtained.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Now the invention will be described in detail below with reference to the accompanied drawings which illustrate the preferred embodiments of the invention. Although the invention will be described in connection with the embodiments thereof, changes and modifications are obvious to the persons skilled in the art without departing from the true spirit of the invention. Therefore, the invention will be defined by the appended claims.

Structure

Figure 1:
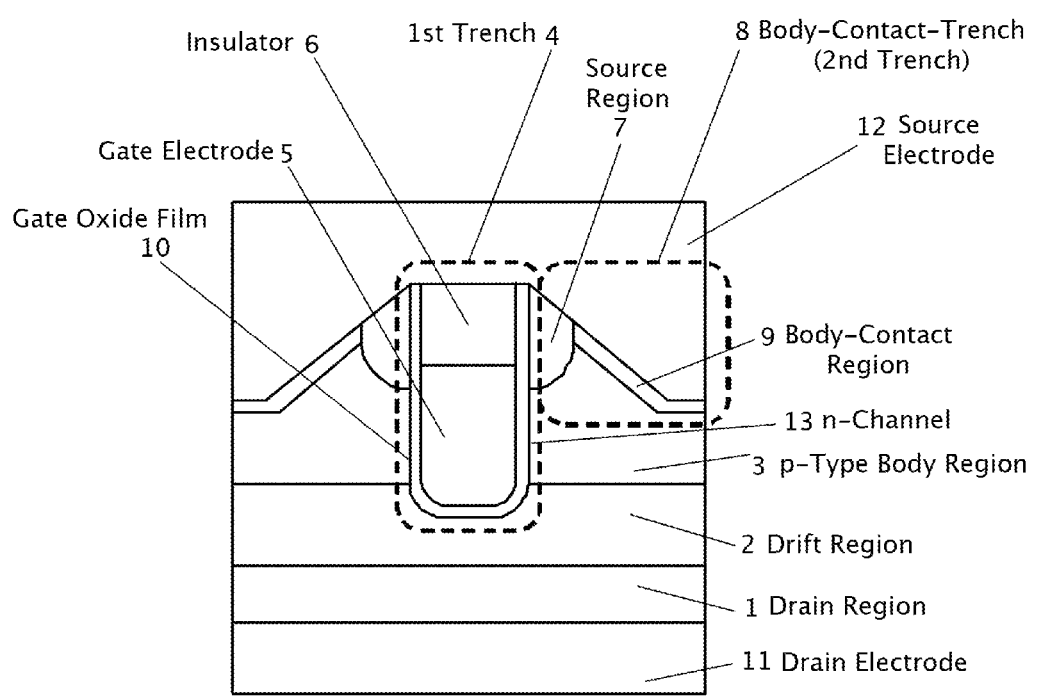
FIG. 1 is the cross sectional view of a trench gate MOSFET according to the invention.
Figure 2A:
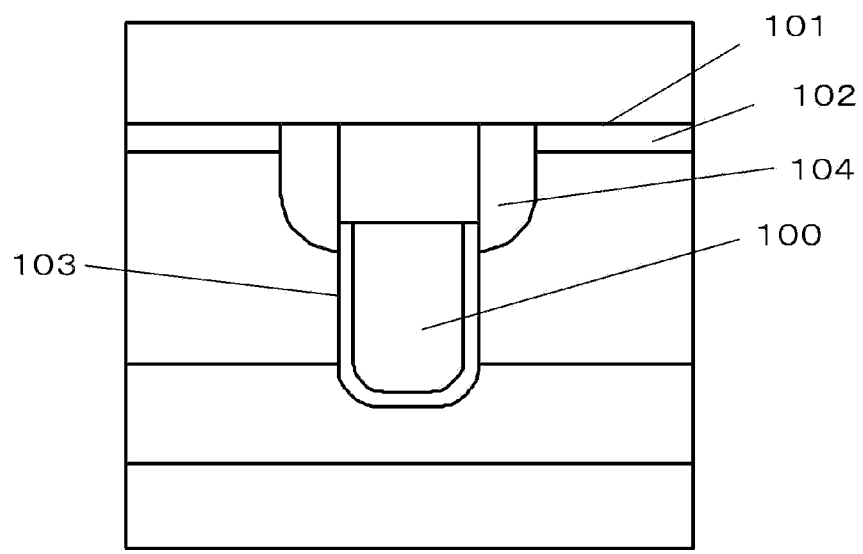
FIG. 2(a) is the cross sectional view of a conventional trench gate MOSFET.
Figure 2B:
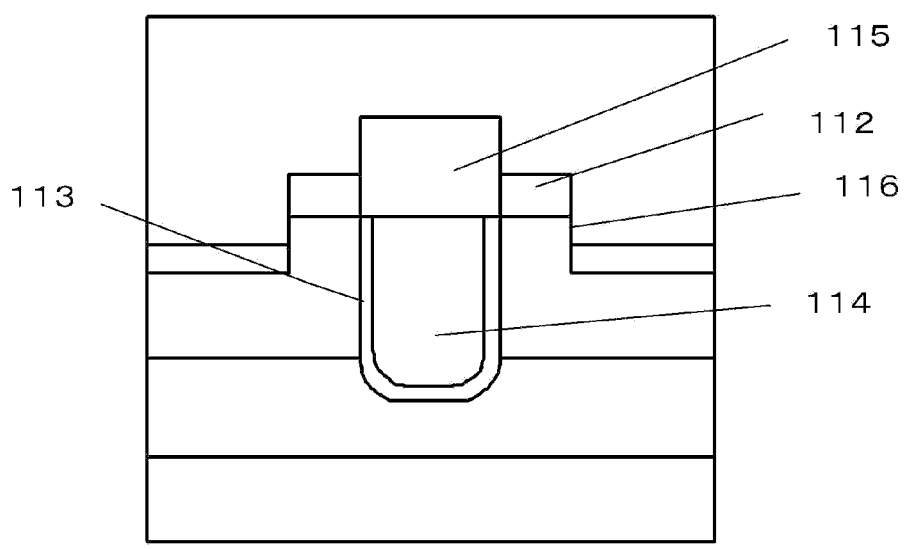
FIG. 2(b) is the cross sectional view of another conventional trench gate MOSFET.

FIG. 1 is the cross sectional view of a trench gate MOSFET according to the invention. Referring now to FIG. 1, lightly doped n-type drift region 2 is formed on a heavily doped n-type silicon substrate that works for drain region 1. Lightly doped p-type body region 3 is formed on n-type drift region 2. A plurality of first trenches 4 are formed selectively from the surface of p-type body region 3. Each first trench 4 is extended into n-type drift region 2. Polysilicon that works for gate electrode 5 is loaded in the lower portion of each first trench 4 with gate oxide film 10 interposed between gate electrode 5 and first trench 4. Insulator 6 is loaded in the upper portion of first trench 4. Insulator 6 is on gate electrode 5. Along the side wall of the first trench 4 upper portion, in which there is no polysilicon gate electrode 5, $p^+$ source region 7 is formed.

A concave portion is formed in the entire area between adjacent first trenches 4. The bottom plane of the concave portion is set to be lower than the bottom plane of insulator 6 loaded in first trench 4. Hereinafter, the concave portion will be referred to as "body-contact-trench 8" or "second trench 8". The $p^+$ source region 7 surface is exposed to body-contact-trench (second trench) 8. Further, $p^+$ source region 7 is in contact with $p^+$ body-contact region 9 formed in the surface portion of p-type body region 3. Body-contact-trench (second trench) 8 is in contact with source electrode 12.

Operation

As a voltage higher than the threshold voltage is applied to gate electrode 5, n-channel 13 is formed along the surface of p-type body region 3 in contact with gate oxide film 10 in first trench 4. A current corresponding to the applied voltage flows from drain electrode 11 to source electrode 12 via drain region 1, n-type drift region 2, n-channel 13 and $n^+$ source region 7. Since the electrons injected from source electrode 12 are current carriers in the n-type MOSFET shown in FIG. 1, the electrons flow opposite to the current flow direction described above. While no voltage is applied to gate electrode 5, the voltage applied between drain electrode 11 and source electrode 12 is sustained by the pn-junction between p-type body region 3 and n-type drift region 2 and a depletion layer expands mainly toward the drift region 2 side.

As the voltage applied between drain electrode 11 and source electrode 12 is raised gradually, the electric field in the pn-junction becomes stronger gradually, causing an avalanche breakdown. Among the holes and electrons caused by the avalanche breakdown, the holes are made to flow through p-type body region 3 and extracted from $p^+$ body-contact region 9 to source electrode 12. A voltage drop is caused in p-type body region 3 which provides the hole current path corresponding to the hole current that flows through p-type body region 3. As the voltage drop becomes greater than the built-in potential of the pn-junction (about 0.6 V) formed of $n^+$ source region 7 and p-type body region 3, the pn-junction is biased forward and electrons are injected from $n^+$ source region 7 to p-type body region 3. By the electron injection, the parasitic BJT is turned on. Since a current, the density of which is higher than the allowable current density, flows in many cases, the device breaks down. To prevent the parasitic BJT from being turned on, it is effective to lower the p-type body region 3 resistance that works for the body resistance of the parasitic BJT.

In the structure according to the invention, the pn-junction, formed of p-type body region 3 and n-type drift region 2, which causes a hole current and body-contact region 9, through which the hole current is extracted, are close to each other. In other words, the distance between the pn-junction, formed of p-type body region 3 and n-type drift region 2, that causes a hole current and body-contact region 9, through which the hole current is extracted, is short. Therefore, the body resistance is low. Since the body-contact region 9 bottom is positioned deeper than $n^+$ source region 7, the potential around $n^+$ source region 7 is hardly affected by the voltage drop caused by the hole current.

Manufacturing Method

Figure 3:
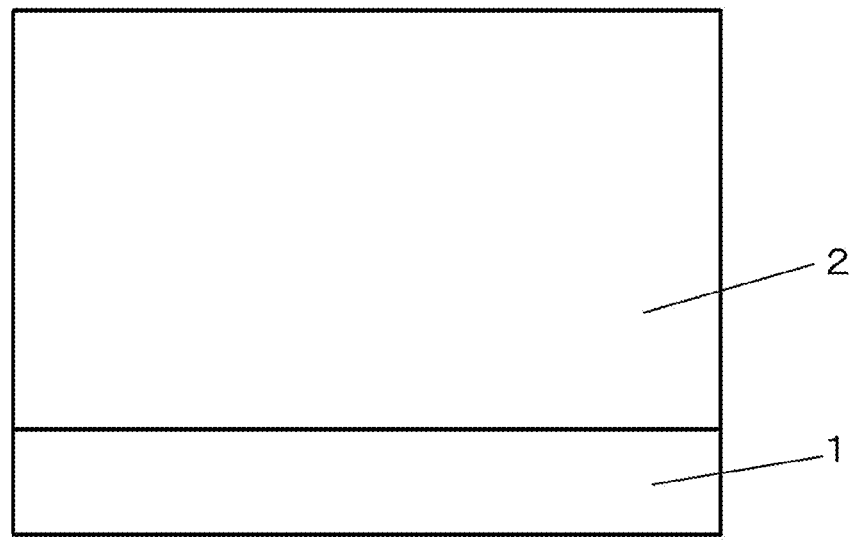
FIG. 3 is a first cross sectional view describing the method for manufacturing a trench gate MOSFET according to the invention.
Figure 4:
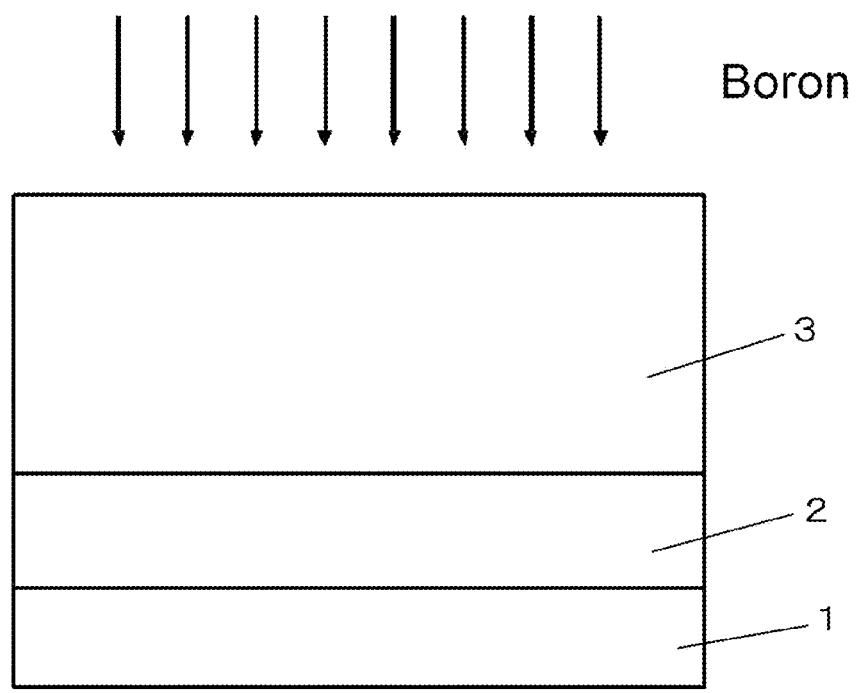
FIG. 4 is a second cross sectional view describing the method for manufacturing the trench gate MOSFET according to the invention.

Now the manufacturing method according to the invention for manufacturing a trench gate MOSFET will be described below with reference to FIGS. 3 through 12. Referring first to FIG. 3, lightly doped n-type drift region 2 is grown epitaxially on a heavily doped n-type silicon substrate that will work for drain region 1. Referring next to FIG. 4, p-type body region 3 is formed by boron ion implantation from the drift region 2 surface and by a subsequent thermal diffusion.

Figure 5:
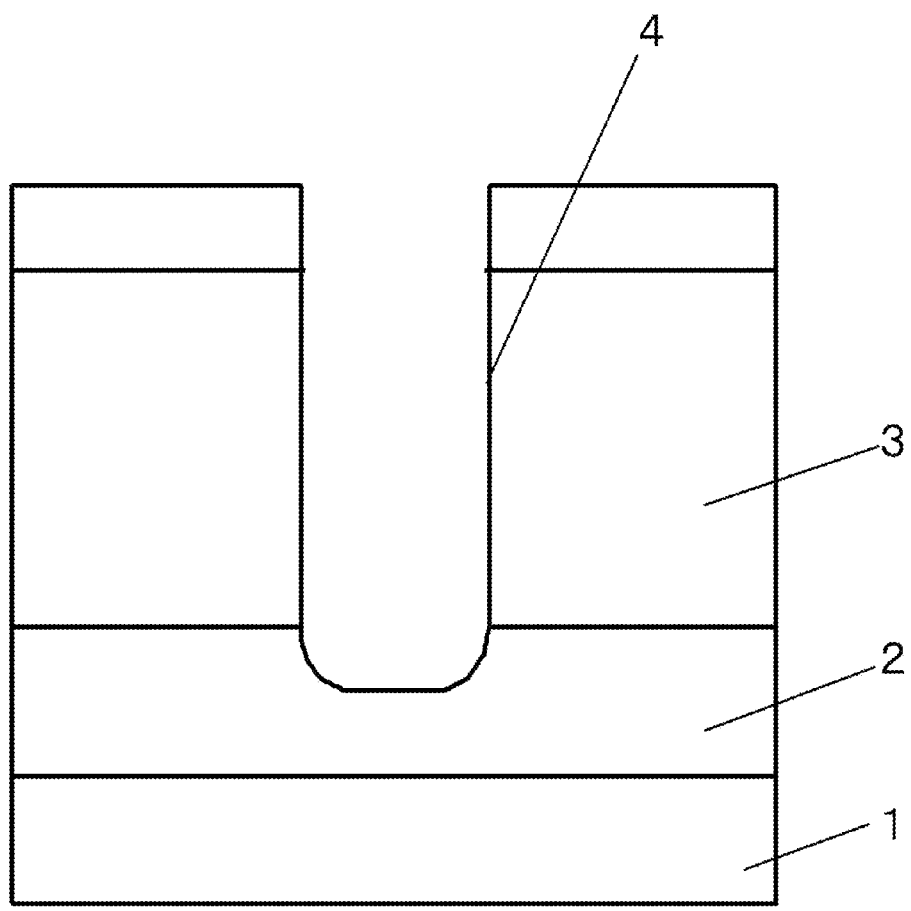
FIG. 5 is a third cross sectional view describing the method for manufacturing the trench gate MOSFET according to the invention.

Referring now to FIG. 5, an SiN film is formed on p-type body region 3 and the SiN film is patterned such that only an opening for forming first trench 4 is formed in the SiN film. Then, trench etching is conducted using the remaining SiN film for a mask to form first trench 4. The trench etching is conducted by the general reactive ion etching (hereinafter referred to as "RIE").

Figure 6:
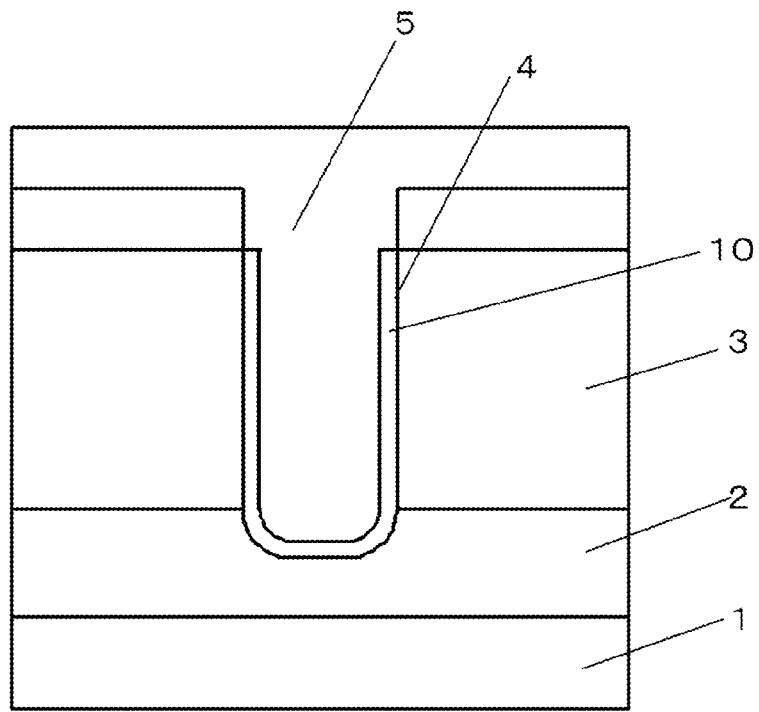
FIG. 6 is a fourth cross sectional view describing the method for manufacturing the trench gate MOSFET according to the invention.
Figure 7:
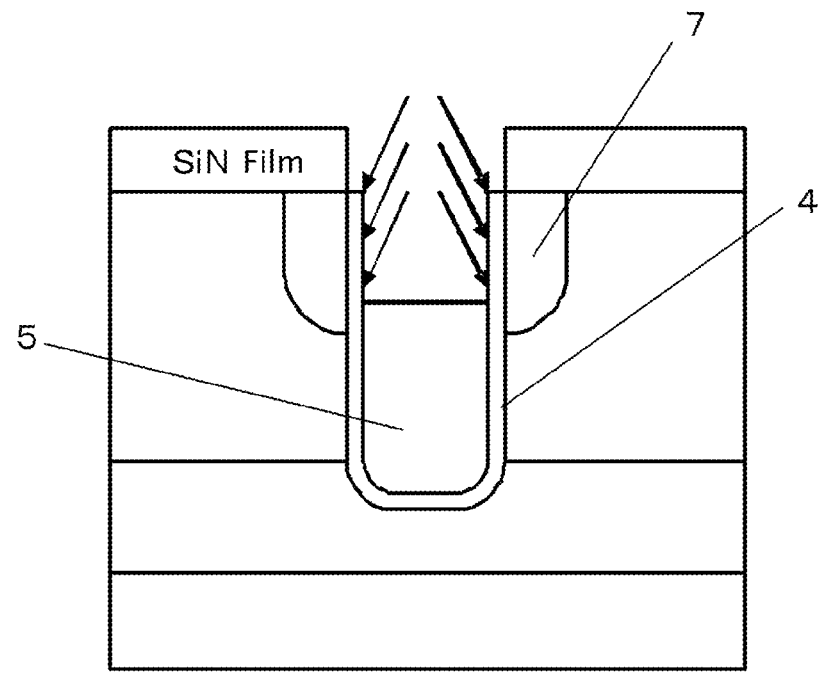
FIG. 7 is a fifth cross sectional view describing the method for manufacturing the trench gate MOSFET according to the invention.

Referring now to FIG. 6, gate oxide film 10 is formed by thermally oxidizing silicon and first trench 4 is filled with polysilicon 5. Referring next to FIG. 7, polysilicon 5 is etched to expose the first trench 4 side wall to a predetermined depth and arsenic ions are implanted to the exposed side wall of first trench 4 to form $n^+$ source region 7. The ion implantation for implanting the arsenic ions to the first trench 4 side wall is conducted at an oblique angle from the vertical direction. In the oblique ion implantation, the SiN film on p-type body region 3 and polysilicon 5 in first trench 4 function as masks.

Figure 8:
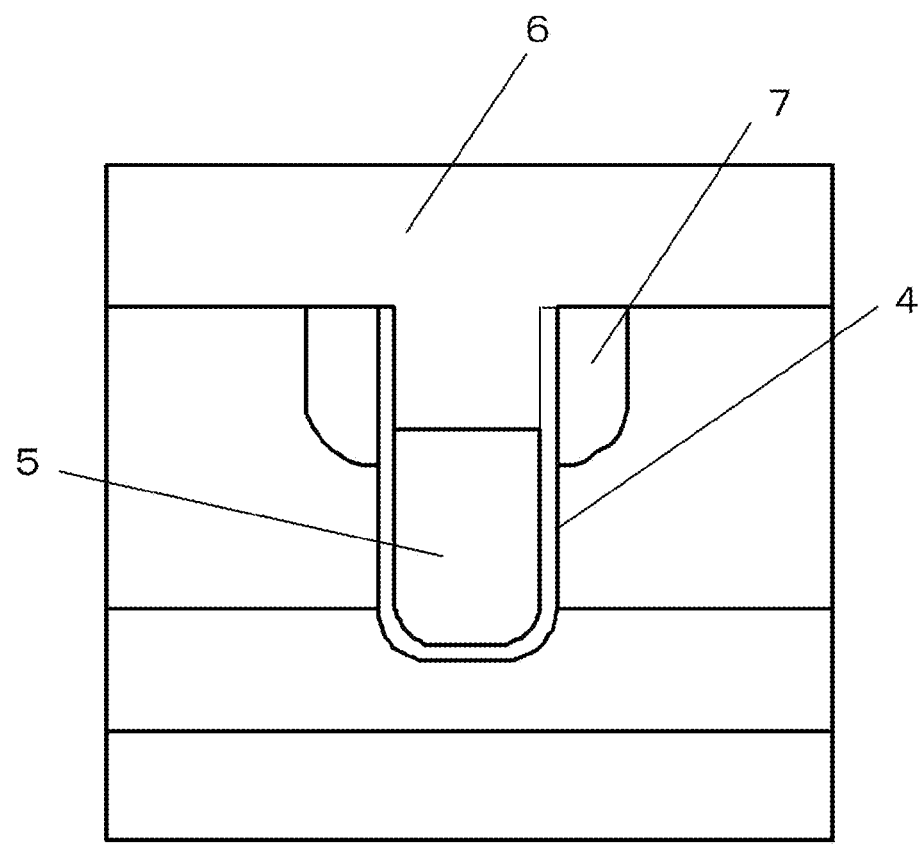
FIG. 8 is a sixth cross sectional view describing the method for manufacturing the trench gate MOSFET according to the invention.

Referring now to FIG. 8, the SiN film on p-type body region 3 is removed and first trench 4 is filled with insulator 6. It is preferable to employ a low-temperature oxide (hereinafter referred to as an "LTO") for insulator 6.

Figure 9:
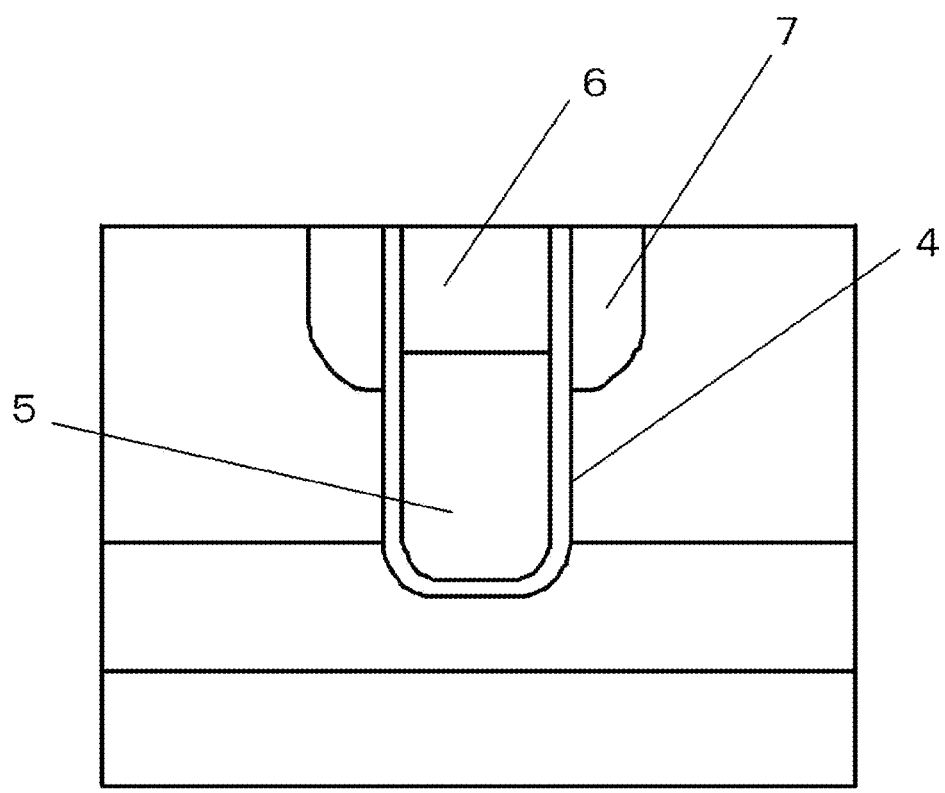
FIG. 9 is a seventh cross sectional view describing the method for manufacturing the trench gate MOSFET according to the invention.

Referring now to FIG. 9, insulator 6 is flattened such that the upper surface of insulator 6 buried in first trench 4 is at the same level with the silicon substrate surface, from which any trench is not formed. It is preferable to employ chemical mechanical polishing (hereinafter referred to as "CMP") in the flattening.

Figure 10:
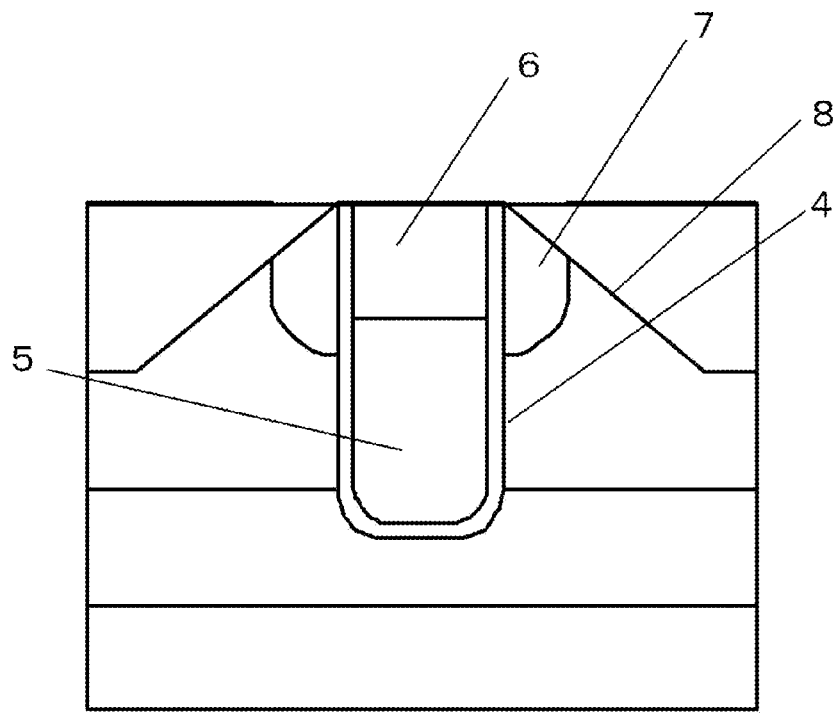
FIG. 10 is an eighth cross sectional view describing the method for manufacturing the trench gate MOSFET according to the invention.

Referring now to FIG. 10, body-contact-trench (second trench) 8 is formed by etching using insulator 6 buried in first trench 4 as a mask. The side wall of body-contact-trench (second trench) 8 is a slope connecting the vicinity of the first trench 4 upper edge and the bottom plane of body-contact-trench (second trench) 8 positioned deeper than the gate electrode upper surface. Hereinafter the side wall of body-contact trench (second trench) 8 provided with a slope will be referred to as the "slanted inner surface of body-contact-trench (second trench) 8."

By virtue of the provision of the slanted inner surface, body-contact-trench (second trench) 8 is formed by etching such that $n^+$ source region 7 is left intact and the bottom plane of body-contact-trench (second trench) 8 is positioned deeper than the upper surface of polysilicon gate electrode 5. Since photolithography is not employed in forming body-contact-trench (second trench) 8, it is not necessary to design the trench-gate MOSFET considering a certain size margin for absorbing the liable alignment deviations. Therefore, the chip size may be reduced.

Figure 11:
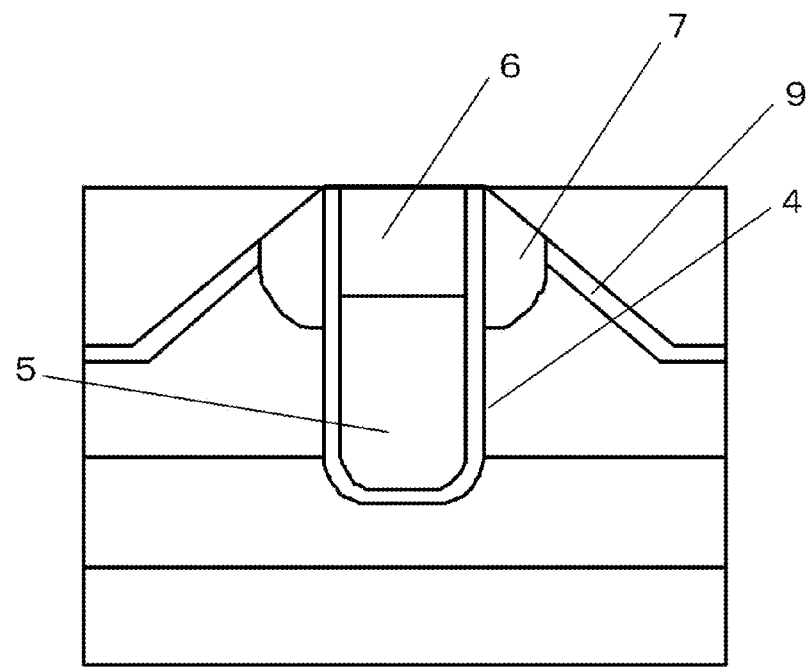
FIG. 11 is a ninth cross sectional view describing the method for manufacturing the trench gate MOSFET according to the invention.

Referring now to FIG. 11, $BF_2$ ions are implanted to the entire surface to form $p^+$ body-contact region 9. The impurity concentration in $p^+$ body-contact region 9 is set to be high enough to lower the contact resistance thereof with p-type body region 3 but to be lower the impurity concentration in $n^+$ source region 7.

Figure 12:
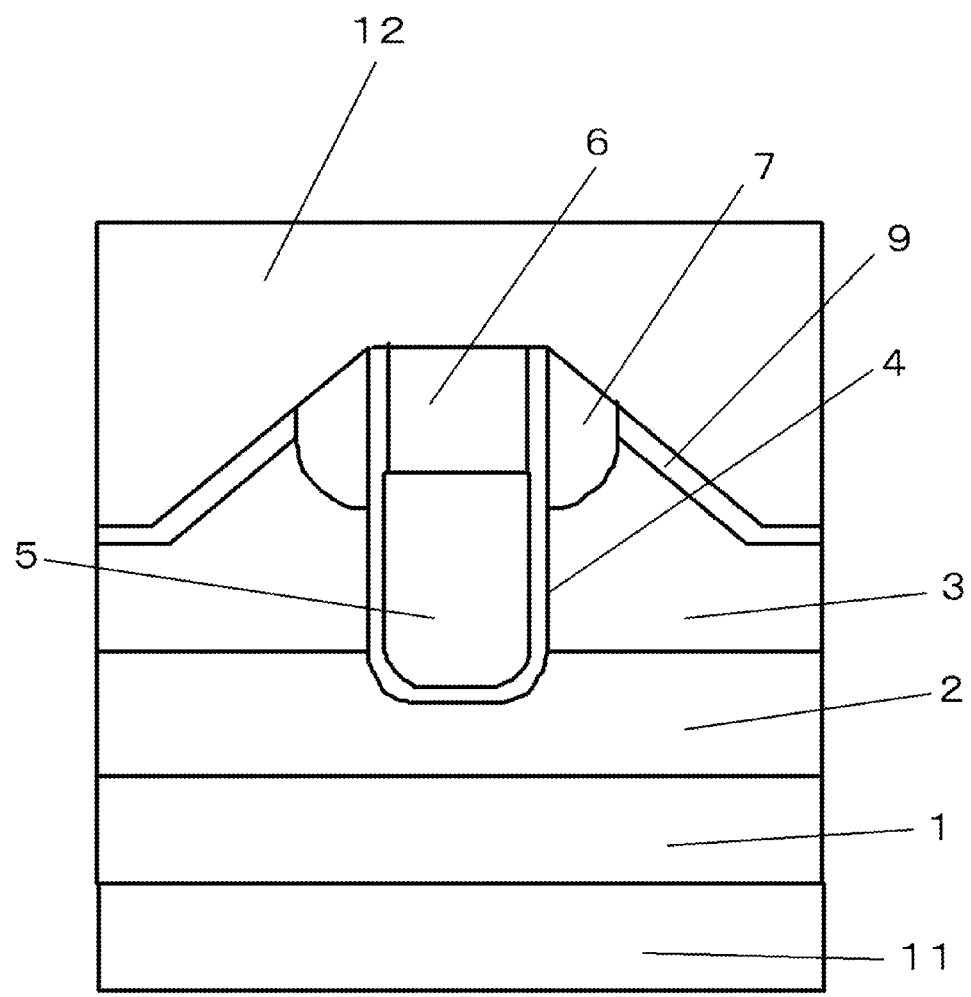
FIG. 12 is a tenth cross sectional view describing the method for manufacturing the trench gate MOSFET according to the invention.

Referring finally to FIG. 12, source electrode 11 is formed on the front surface side and drain electrode 12 on the back surface side.

Figure 13:
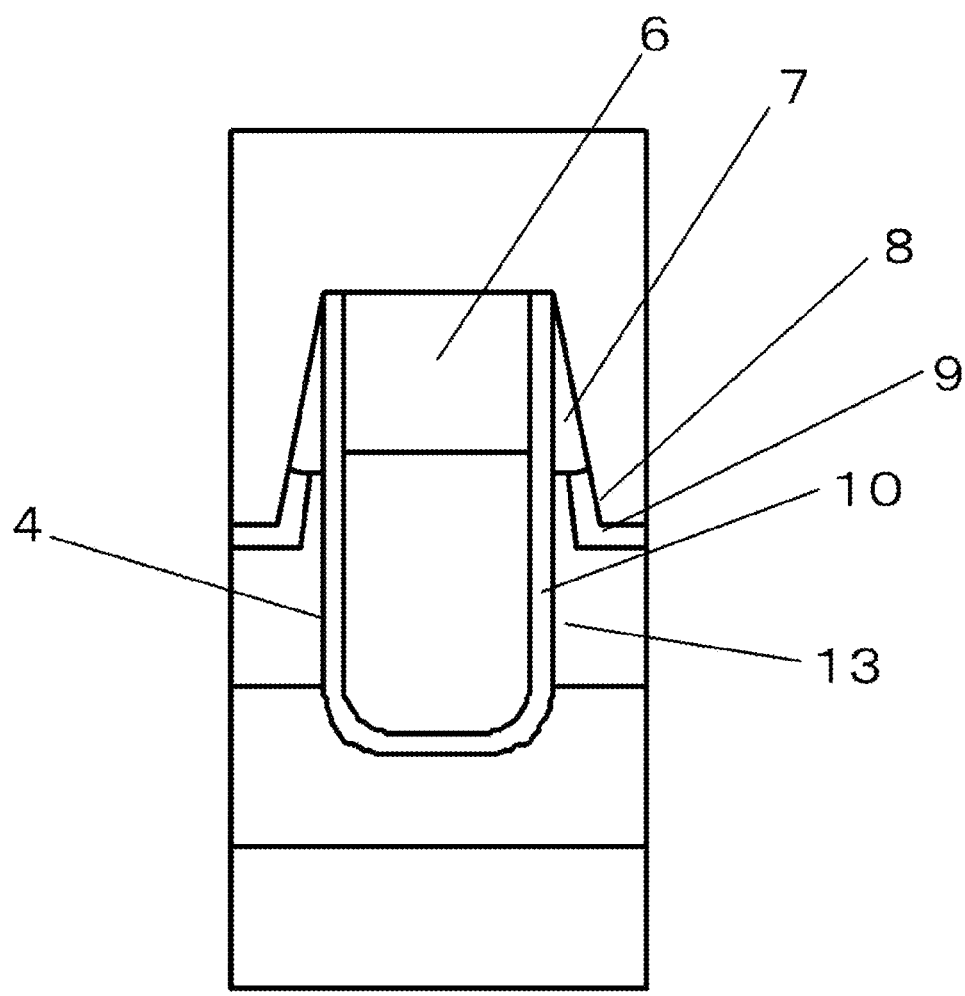
FIG. 13 is a cross sectional view of a trench gate MOSFET, in which the body-contact-trench has a steep inner surface.

Now the angle of the slanted inner surface connecting the vicinity of the first trench 4 upper edge and the bottom plane of body-contact-trench (second trench) 8 will be described. As the slant angle from the horizontal plane is widened to narrow the spacing between first trenches 4 as shown in FIG. 13 and to increase the channel density, body-contact-trench (second trench) 8 affects the formation of n-channel 13 sometimes. As the spacing between first trenches 4 is narrowed as shown in FIG. 13, $p^+$ body-contact region 9 and gate oxide film 10 come closer to each other. As $p^+$ body-contact region 9 and gate oxide film 10 come closer to each other, the impurity concentration in $p^+$ body-contact region 9 becomes more influential on the region, in which n-channel 13 is formed. Since $p^+$ body-contact region 9 is heavily doped to lower the contact resistance thereof, the threshold value will be high sometimes, if the high impurity concentration in $p^+$ body-contact region 9 affects n-channel 13. Therefore, it is necessary to widen the spacing between first trenches 4 by setting the slant angle of the slanted inner surface of body-contact-trench (second trench) 8 to be small enough so that the threshold value may not be affected by $p^+$ body-contact region 9.

If the contact point, at which the slanted inner surface starts, on the side wall of insulator 6 in first trench 4 is lowered in forming body-contact-trench (second trench) 8 such that entire $n^+$ source region 7 is etched away, it will not be preferable, since the device will not function as a MOSFET due to the absence of $n^+$ source region 7. By the manufacturing method according to the invention, body-contact-trench (second trench) 8 is formed employing insulator 6 in first trench 4 as a mask. Therefore, it is unavoidable for the contact point of body-contact-trench (second trench) 8 and insulator 6 to be lowered to some extents in the step of etching for forming body-contact-trench (second trench) 8.

Now, how the extent of lowering the upper edge portion of body-contact-trench (second trench) 8 from the upper edge portion of first trench 4 (hereinafter referred to as the "extent of over-etching") affects the performances of the semiconductor device according to the invention will be described below.

Figure 14:
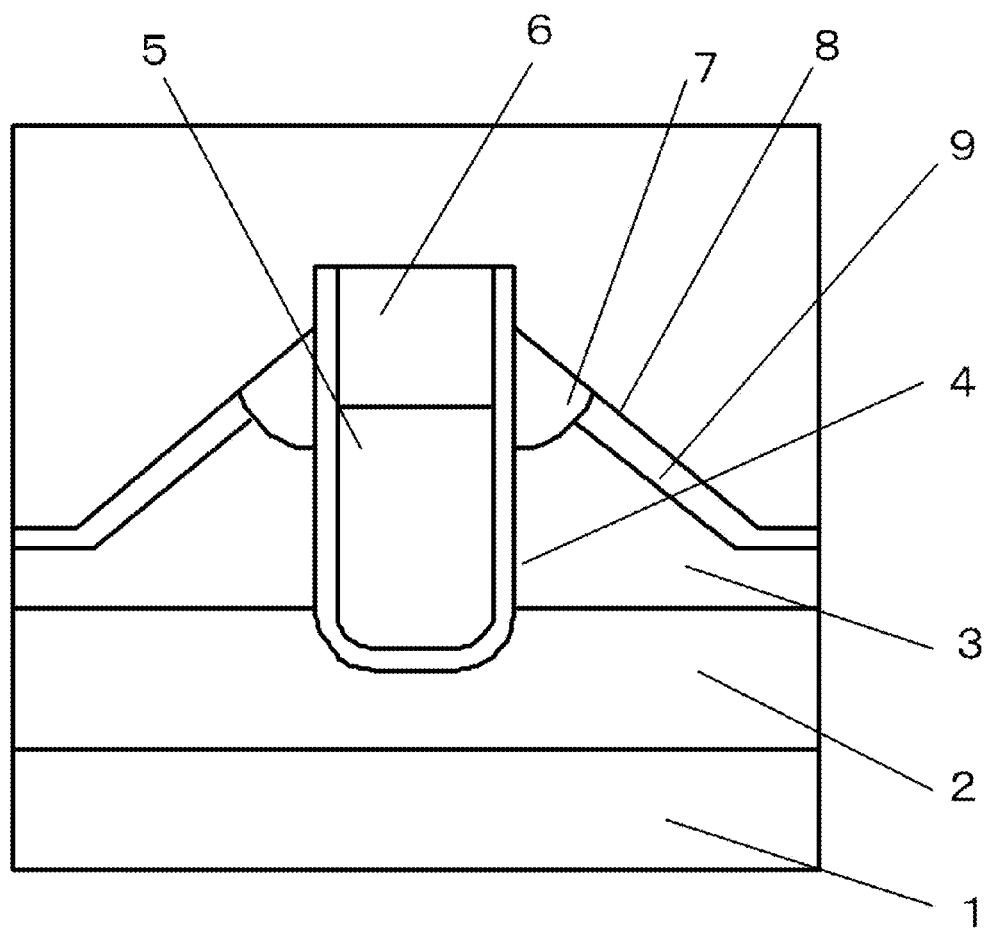
FIG. 14 is a cross sectional view of a trench gate MOSFET, in which a part of the $n^+$ source region is etched.

FIG. 14 is a cross sectional view of a trench gate MOSFET, in which a part of the $n^+$ source region is etched. In the state illustrated in FIG. 14, any unfavorable effect is not caused by the over-etching. On the contrary, $n^+$ source region 7 narrowed lowers the resistance thereof, affecting the MOSFET performances favorably.

Figure 15:
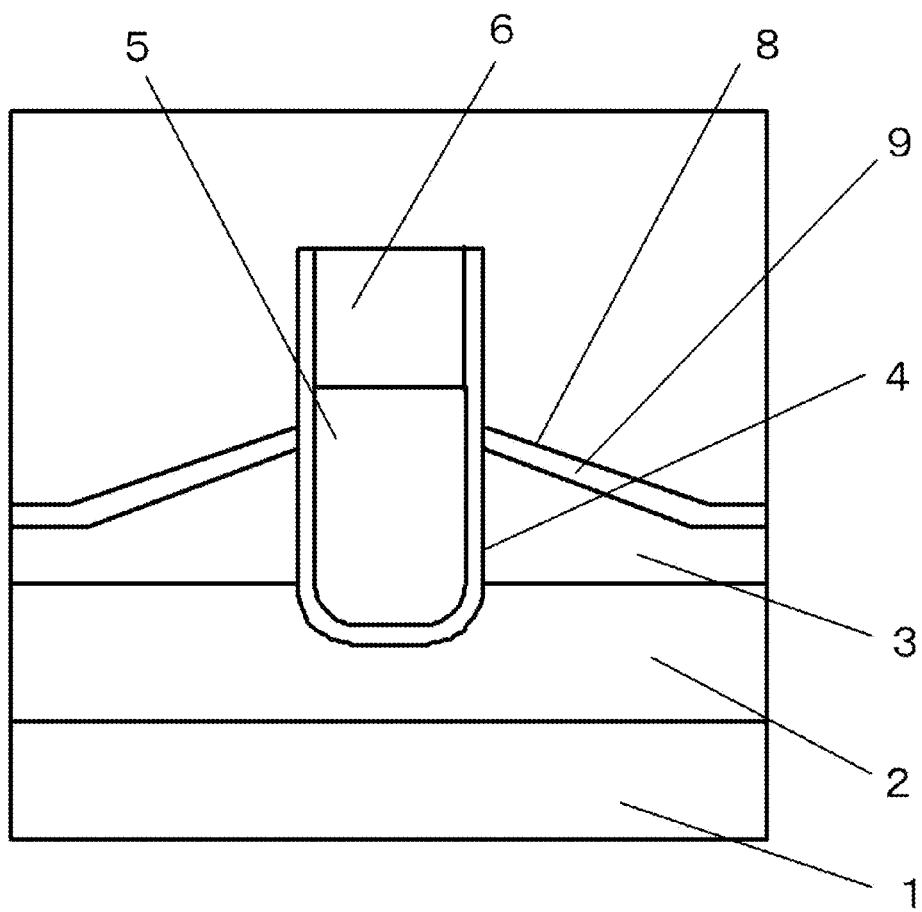
FIG. 15 is a cross sectional view of a trench gate MOSFET, in which the $n^+$ source region is etched away completely.

FIG. 15 is a cross sectional view of a trench gate MOSFET, in which $n^+$ source region 7 is etched away completely. In the state illustrated in FIG. 15, the semiconductor device never functions as a MOSFET. For avoiding the over-etched state as described in FIG. 15, it is effective to lower the upper surface of polysilicon gate electrode and to position $n^+$ source region 7 deep from the first trench 4 upper edge as described in FIG. 16.

Figure 16:
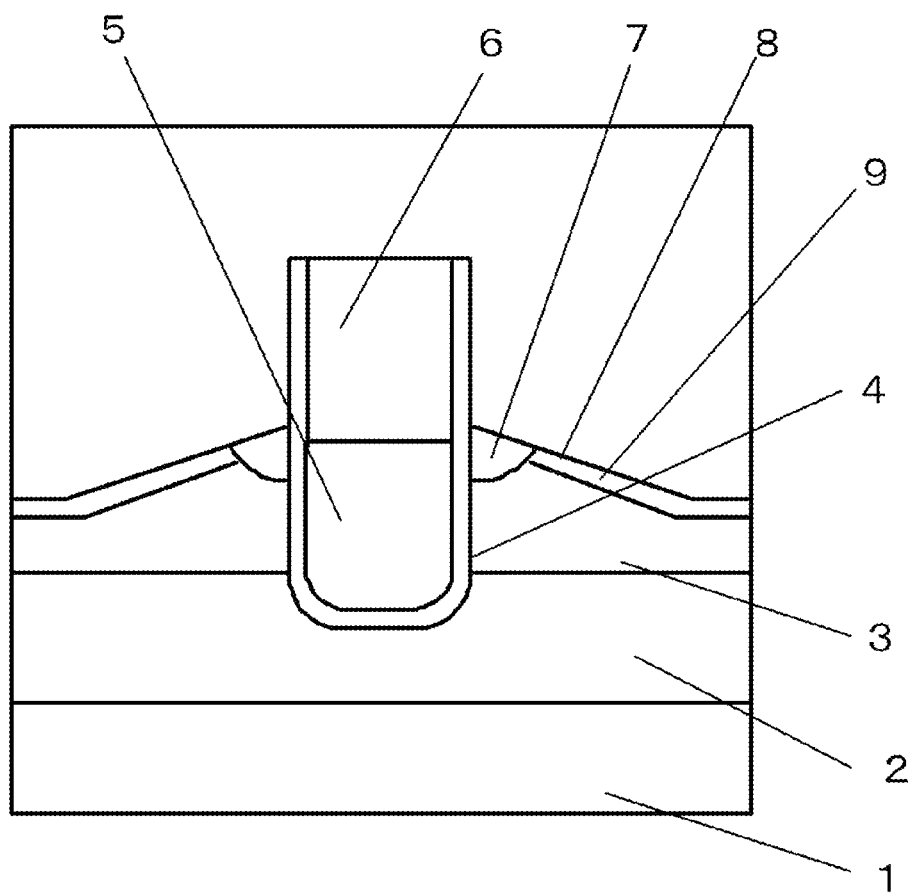
FIG. 16 is a cross sectional view of a trench gate MOSFET, in which the semiconductor substrate is over-etched in the same extent as in FIG. 15 but the $n^+$ source region is not etched away but remaining.

FIG. 16 is a cross sectional view of a trench gate MOSFET, in which p-type body region 3 is over-etched in the same extent as in FIG. 15, but $n^+$ source region 7 is not etched away but still remains. Even if the etching amount is large, $n^+$ source region 7 will be left securely by setting the etching amount of polysilicon gate electrode 5 to be large, that is, by positioning the upper surface of gate electrode 5 low and by forming $n^+$ source region 7 to a level deep from the first trench 4 upper edge.

Moreover, since the ion implantation to the first trench 4 sidewall for forming $n^+$ source region 7 is conducted at an oblique angle from the vertical direction, the impurity concentration in $n^+$ source region 7 is high uniformly on the side of the first trench 4 sidewall. Therefore, even if the remaining portion of $n^+$ source region 7 is small due to the formation of second trench 8, a heavily doped portion will remain on the side of the first trench 4 sidewall.

Figure 17:
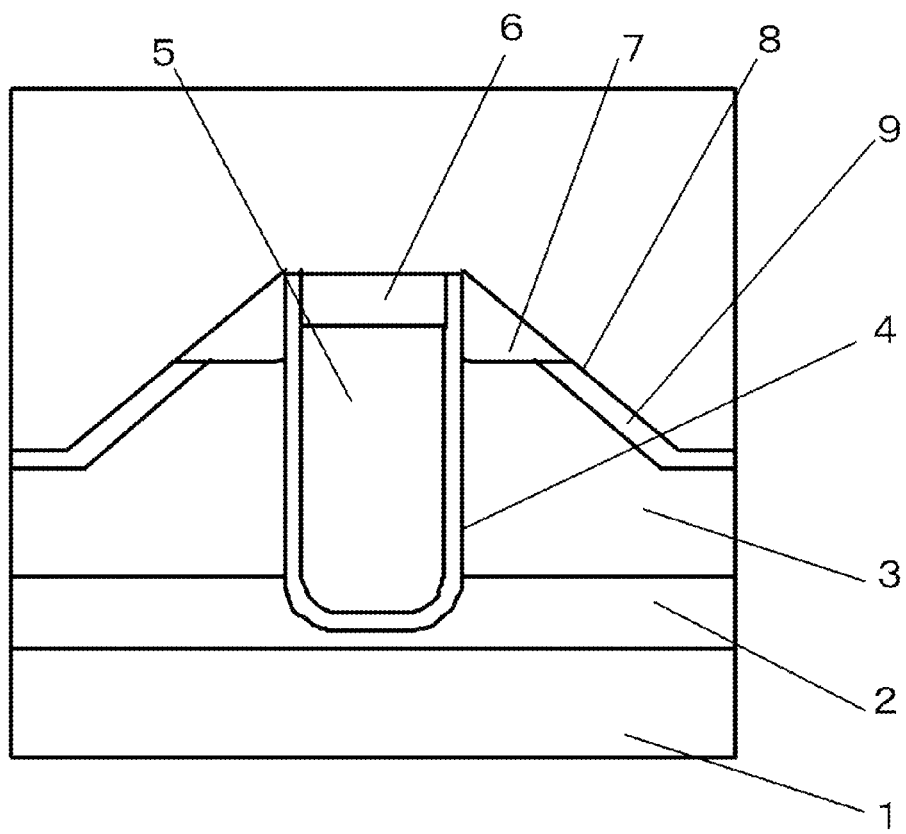
FIG. 17 is a cross sectional view of a trench gate MOSFET, in which the $n^+$ source region is formed by ion implantation from the substrate surface and by the subsequent thermal diffusion.

FIG. 17 is a cross sectional view of a trench gate MOSFET, in which $n^+$ source region 7 is formed not by the ion implantation from the side wall of first trench 4 but by ion implantation from the surface of the substrate, including p-type body region 3 on n-type drift region 2, and by the subsequent thermal diffusion.

If $n^+$ source region 7 is formed by ion implantation from the substrate surface and by the subsequent thermal diffusion, the effects the same with the effects which the trench gate MOSFET according to the invention exhibits will be obtained as far as any over-etching is not caused. If a large over-etching is caused, it will be necessary to form n⁺ source region 7 at a deeper level corresponding to the extent of over-etching.

Even if n⁺ source region 7 is remaining after the over-etching, it will not be preferable to cause the very high contact resistance of n⁺ source region 7. The very high contact resistance of n⁺ source region 7 is caused, since the most heavily doped surface portion of n⁺ source region 7 is etched away and the lightly doped portion of n⁺ source region 7 is remaining. Therefore, the appropriate extent of etching for forming body-contact-trench (second trench) 8 is narrow according to the manufacturing method described with reference to FIG. 17.

As described above, it is more preferable for n⁺ source region 7 in the trench gate MOSFET according to the invention to be formed by a diffusion from the trench sidewall than from the substrate surface.

According to the invention described above, the spacing between the adjacent first trenches is narrowed to the extreme of the range, in which the MOSFET functions are obtained, and low ON-state resistance is obtained by increasing the n-channel density. Since a body-contact-trench is formed between the adjacent first trenches in a self-aligning manner, a high avalanche withstanding capability is obtained.

Although the invention has been described in connection with a trench gate MOSFET, the invention is applicable also to the trench gate IGBT, since the trench gate structure on the front surface side may be formed in the same manner as described above.

Thus, a trench gate semiconductor device and the method of manufacturing the same have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

This application is based on and claims priority to Japanese Patent Application 2009-295036, filed on Dec. 25, 2009. The disclosure of the priority application in its entirety, including the drawings, claims, and the specification thereof, is incorporated herein by reference.

What is claimed is:

1. A trench gate semiconductor device comprising:
   a semiconductor substrate comprising a drift region of a second conductivity type and a body region of a first conductivity type on the drift region;
   a source region of the second conductivity type formed selectively in a surface portion of the body region;
   a first trench formed from a surface of the body region to the drift region, the first trench being in contact with the source region;
   a polysilicon gate electrode in a lower portion of the first trench with a gate oxide film interposed between the polysilicon gate electrode and an inner wall of the first trench;
   an insulator in an upper portion of the first trench, the insulator being on the polysilicon gate electrode;
   the source region comprising a lower end surface positioned lower than an upper surface of the polysilicon gate electrode;
   a second trench in a surface portion of the semiconductor substrate adjacent the first trench, the second trench comprising a slanted inner surface providing the second trench with a widest trench width in an opening thereof and a bottom plane positioned lower than the lower end surface of the source region, the slanted inner surface being in contact with the source region in contact with the first trench;
   a body-contact region of the first conductivity type in the surface portion of the body region, the body-contact region being in contact with the slanted inner surface of the second trench;
   and
   the source region being doped more heavily on a side of the first trench surface.

2. The trench gate semiconductor device according to claim 1, wherein the trench gate semiconductor device comprises a MOSFET.

3. The trench gate semiconductor device according to claim 1, wherein the trench gate semiconductor device comprises an IGBT.

4. The trench gate semiconductor device according to claim 1, wherein the insulator is entirely within the upper portion of the first trench.

* * * * *